(12) United States Patent
Choi

(10) Patent No.: US 7,656,728 B2
(45) Date of Patent: Feb. 2, 2010

(54) SENSE AMPLIFIER SCREEN CIRCUIT AND SCREEN METHOD THEREOF

(75) Inventor: Won Jun Choi, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 61 days.

(21) Appl. No.: 11/823,302

(22) Filed: Jun. 26, 2007

(65) Prior Publication Data

US 2008/0159028 A1 Jul. 3, 2008

(30) Foreign Application Priority Data

Dec. 29, 2006 (KR) .................. 10-2006-0138800

(51) Int. Cl.
*G11C 29/00* (2006.01)
(52) U.S. Cl. .................. 365/201; 365/189.09; 365/207; 365/203
(58) Field of Classification Search .......... 365/201, 365/189.09, 207, 203
See application file for complete search history.

(56) References Cited

U.S. PATENT DOCUMENTS

| 6,346,038 | B1 * | 2/2002 | Kajiwara et al. ............ 451/339 |
| 6,347,058 | B1 * | 2/2002 | Houghton et al. ........... 365/203 |
| 7,164,612 | B1 | 1/2007 | Eleyan et al. |
| 7,286,427 | B2 * | 10/2007 | Perner ........................ 365/207 |

FOREIGN PATENT DOCUMENTS

KR  KO-10-2000-0004247 A    1/2000

* cited by examiner

*Primary Examiner*—Thong Q Le
(74) *Attorney, Agent, or Firm*—John P. White; Cooper & Dunham LLP

(57) ABSTRACT

A sense amplifier screen circuit and a screen method thereof are disclosed. The sense amplifier screen circuit includes a test mode signal generator for generating a test mode signal, a voltage regulator for regulating a bit line precharge voltage in response to the test mode signal, and a driving controller for generating a sense amplifier drive signal and a bit line equalize signal in response to the test mode signal.

14 Claims, 2 Drawing Sheets

SENSE AMPLIFIER SCREEN CIRCUIT AND SCREEN METHOD THEREOF

BACKGROUND

The present disclosure relates to a sense amplifier screen circuit and a screen method thereof, and more particularly to a sense amplifier screen circuit and method wherein the characteristics and sensing margin of a sense amplifier can be readily screened.

In general, sense amplifiers are classified into a bit line sense amplifier and a data bus sense amplifier. The bit line sense amplifier functions to sense and amplify data placed on a bit line and output the sensed and amplified data to a data bus, and the data bus sense amplifier functions to again sense and amplify the data amplified by the bit line sense amplifier and output the sensed and amplified data to a data output buffer.

A description will hereinafter be given of the operation of a cross coupled latch type amplifier, which is one example of such sense amplifiers.

First, when bit lines are precharged with a precharge voltage (for example, half of an internal voltage Vcore), potentials of a pair of bit lines BL and /BL are equalized to remove a voltage difference between a bit line connected to a selected memory cell and a bit line not connected thereto.

Thereafter, when a word line selected as a result of analysis of an address inputted to a row decoder is turned on, charge sharing occurs between a cell capacitance and a bit line capacitance, resulting in the generation of a potential difference between a bit line connected to a selected memory cell and a bit line not connected thereto. At this time, a potential difference between a pair of bit lines BL and /BL is amplified by the cross coupled latch type amplifier.

Notably, all sense amplifiers in cells are not uniformly operated due to factors such as process parameters. For this reason, an abnormal sense amplifier which incorrectly amplifies a potential difference between a pair of bit lines BL and /BL may be present in one cell, whereas a normal sense amplifier which correctly amplifies a potential difference between a pair of bit lines BL and /BL may be present in another cell. However, nowadays, there is no method capable of screening faulty sense amplifiers existing in cells.

BRIEF SUMMARY

In an aspect of the present disclosure, a sense amplifier screen circuit comprises a test mode signal generator for generating a test mode signal, a voltage regulator for regulating a bit line precharge voltage in response to the test mode signal, and a driving controller for generating a sense amplifier drive signal and a bit line equalize signal in response to the test mode signal.

Preferably, the test mode signal generator comprises a test mode signal generation circuit for generating first and second test mode signals, and a logic circuit for performing a logic operation with respect to the first and second test mode signals to generate a third test mode signal.

The logic circuit may perform an OR operation.

The voltage regulator may apply any one of an internal voltage, an external voltage, a ground voltage and a variable voltage as the bit line precharge voltage according to a combination of the first and second test mode signals.

The variable voltage may be set to a desired level through a pad.

Preferably, the voltage regulator comprises a first logic circuit configured to receive the first and second test mode signals and generate a pull-up signal, a second logic circuit configured to receive the first and second test mode signals and generate a pull-down signal to pull the bit line precharge voltage down, and a third logic circuit configured to receive the first and second test mode signals and generate a drive voltage to control driving of a voltage generator which generates the bit line precharge voltage.

Each of the first and second logic circuits may perform an AND operation, and the third logic circuit may perform an OR operation.

The voltage regulator may further comprise a pull-up device for pulling the bit line precharge voltage up in response to the pull-up signal, and a pull-down device for pulling the bit line precharge voltage down in response to the pull-down signal.

The pull-up device may be a p-channel metal oxide semiconductor (PMOS) transistor, and the pull-down device may be an n-channel metal oxide semiconductor (NMOS) transistor.

The voltage regulator may further comprise a pad for applying a voltage of a predetermined level as the bit line precharge voltage.

Preferably, the driving controller comprises a drive voltage generator configured to receive the third test mode signal and generate first and second drive voltages to drive the sense amplifier, and an enable controller for controlling enabling of a bit line equalize signal in response to the third test mode signal.

In another aspect of the present invention, a sense amplifier screen method comprises a) generating first to third test mode signals, b) regulating a bit line precharge voltage in response to the first and second test mode signals, and c) equalizing voltages of bit lines with the bit line precharge voltage in response to the third test mode signal.

Preferably, the step b) comprises pulling the bit line precharge voltage up or down in response to the first and second test mode signals.

Alternatively, the step b) may comprise generating a voltage applied through a pad as the bit line precharge voltage in response to the first and second test mode signals.

The step b) may further comprise stopping driving of a bit line precharge voltage generator in response to the first and second test mode signals.

The step c) may further comprise stopping driving of a sense amplifier.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF PREFERRED EMBODIMENTS

Preferred embodiments of the present invention will now be described in detail with reference to the accompanying drawings.

In a sense amplifier screen circuit and a screen method thereof including the present invention, a bit line precharge voltage VBLP can be controlled to a high level or low level through a test mode signal, so that the operation characteristics of a sense amplifier can be readily screened. Further, the bit line precharge voltage VBLP can be replaced with a voltage applied externally through a pad using the test mode signal, so that the sensing margin of the sense amplifier can be screened. In addition, data of a high level or low level can be written into all cells through the bit line precharge voltage VBLP, thereby making it possible to reduce a test time.

A sense amplifier screen circuit in an exemplary embodiment of the present invention comprises a test mode signal generator, a voltage regulator, and a driving controller. The configurations of the test mode signal generator, voltage regulator and driving controller will hereinafter be described in detail with reference to FIGS. 1 to 3.

Figure 1:
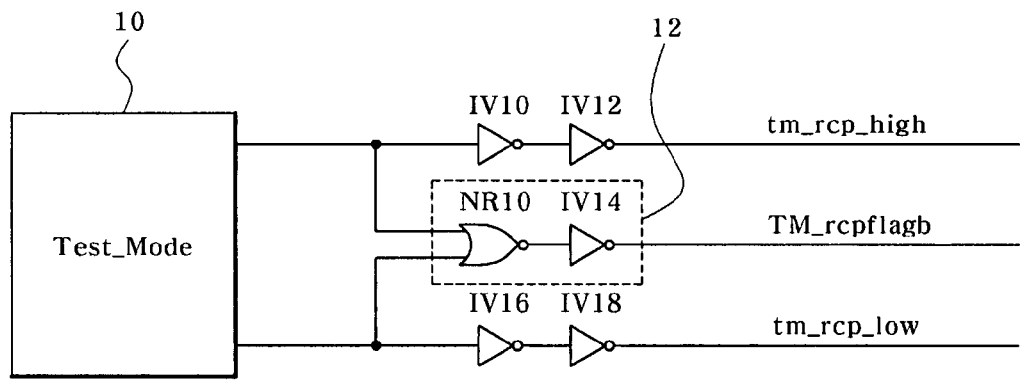
FIG. 1 is a circuit diagram of a test mode signal generator according to an exemplary embodiment of the present invention.

The test mode signal generator includes, as shown in FIG. 1, a test mode signal generation circuit 10 for generating a first test mode signal tm_rcp_high and a second test mode signal tm_rcp_low, and a logic circuit 12 for performing an OR operation with respect to the first test mode signal tm_rcp_high and the second test mode signal tm_rcp_low to generate a third test mode signal tm_rcpflagb. The test mode signal generation circuit 10 may be implemented by a general test mode signal generation circuit.

Figure 2:
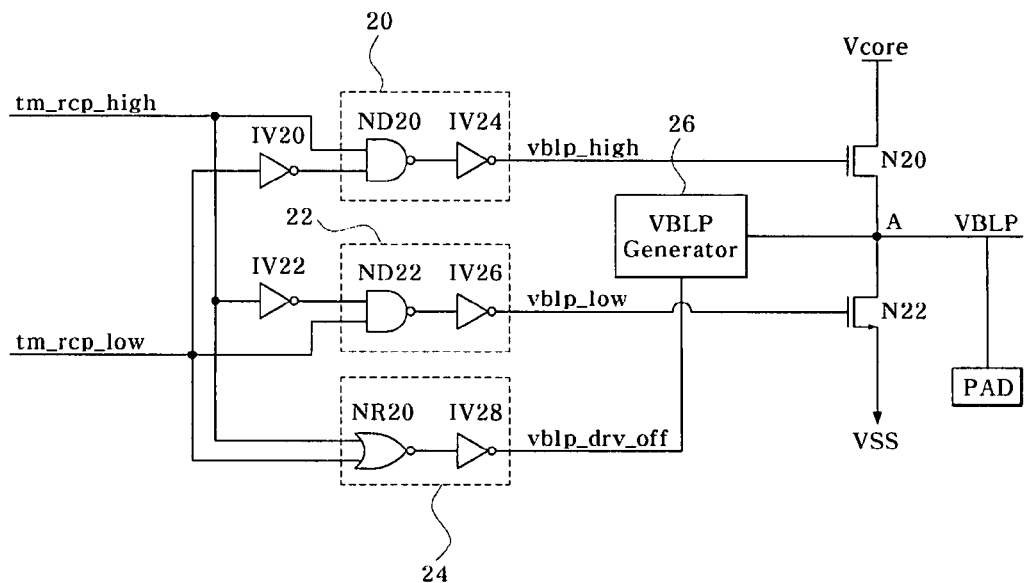
FIG. 2 is a circuit diagram of a voltage regulator according to the exemplary embodiment.

The voltage regulator includes, as shown in FIG. 2, a logic circuit 20 for performing an AND operation with respect to the first test mode signal tm_rcp_high and an inverse of the second test mode signal tm_rcp_low to generate a pull-up signal vblp_high, a logic circuit 22 for performing an AND operation with respect to an inverse of the first test mode signal tm_rcp_high and the second test mode signal tm_rcp_low to generate a pull-down signal vblp_low, and a logic circuit 24 for performing an OR operation with respect to the first test mode signal tm_rcp_high and the second test mode signal tm_rcp_low to generate a drive voltage vblp_drv_off.

The voltage regulator further includes an n-channel metal oxide semiconductor (NMOS) transistor N20 connected between a core voltage supply terminal Vcore and an output node A of a bit line precharge voltage generator 26 for pulling the output node A up in response to the pull-up signal vblp_high, and an NMOS transistor N22 connected between the output node A and a ground voltage terminal VSS for pulling the output node A down in response to the pull-down signal vblp_low.

The voltage regulator further includes a pad PAD connected to the output node A for applying a voltage of a predetermined level to the output node A.

Figure 3:
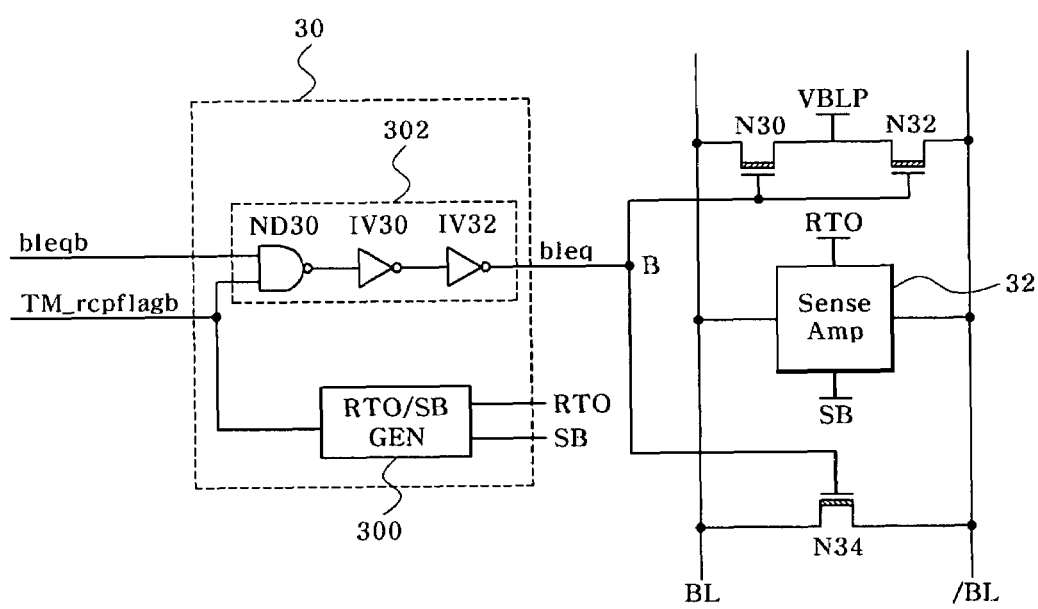
FIG. 3 is a circuit diagram of a driving controller according to the exemplary embodiment.

The driving controller (denoted by reference numeral 30 in FIG. 3) includes, as shown in FIG. 3, a drive voltage generator 300 configured to receive the third test mode signal tm_rcpflagb and generate first and second drive voltages RTO and SB to drive a sense amplifier 32, and an enable controller 302 for controlling enabling of a bit line equalize signal bleq in response to the third test mode signal tm_rcpflagb. The enable controller 302 determines whether to transfer a bit line equalize signal bleqb to a node B, according to whether the third test mode signal tm_rcpflagb is enabled.

The sense amplifier screen circuit with the above-stated configuration in the present exemplary embodiment is operated in response to the first test mode signal tm_rcp_high and the second test mode signal tm_rcp_low to stop the driving of the bit line precharge voltage generator 26 and pull a bit line precharge voltage VBLP up/down to a core voltage Vcore level or ground voltage VSS level. Also, the sense amplifier screen circuit in the present embodiment may compulsorily apply the external voltage of the predetermined level from the pad PAD as the bit line precharge voltage VBLP. At this time, by means of the third test mode signal tm_rcpflagb, the driving of the sense amplifier is stopped and the bit line equalize signal bleq is enabled. Through this operation, the sense amplifier screen circuit in the present embodiment can easily screen the operation characteristics and sensing margin of the sense amplifier.

The operation of the sense amplifier screen circuit in the present embodiment will hereinafter be described in detail with reference to FIGS. 1 to 3.

First, the test mode signal generation circuit 10 shown in FIG. 1 generates the first test mode signal tm_rcp_high and the second test mode signal tm_rcp_low, and the logic circuit 12 shown in FIG. 1 generates the third test mode signal tm_rcpflagb. Here, each of the first test mode signal tm_rcp_high and second test mode signal tm_rcp_low is enabled to a high level, and the third test mode signal tm_rcpflagb is enabled to a high level when the first test mode signal tm_rcp_high or second test mode signal tm_rcp_low is enabled.

Then, the first test mode signal tm_rcp_high and the second test mode signal tm_rcp_low are inputted to the logic circuits 20, 22 and 24 shown in FIG. 2. The logic circuit 20 generates the pull-up signal vblp_high, the logic circuit 22 generates the pull-down signal vblp_low, and the logic circuit 24 generates the drive voltage vblp_drv_off. Here, the pull-up signal vblp_high is enabled to a high level when the first test mode signal tm_rcp_high is enabled and the second test mode signal tm_rcp_low is disabled, and the pull-down signal vblp_low is enabled to a high level when the first test mode signal tm_rcp_high is disabled and the second test mode signal tm_rcp_low is enabled. The drive voltage vblp_drv_off is enabled to a high level when at least one of the first test mode signal tm_rcp_high or the second test mode signal tm_rcp_low is enabled.

When both the first test mode signal tm_rcp_high and second test mode signal tm_rcp_low are low in level, all the pull-up signal vblp_high, pull-down signal vblp_low and drive voltage vblp_drv_off are disabled low in level. As a result, both the NMOS transistor N20 and NMOS transistor N22 are turned off, so that the bit line precharge voltage generator 26 generates the bit line precharge voltage VBLP and outputs it to the node A.

When the first test mode signal tm_rcp_high is high in level and the second test mode signal tm_rcp_low is low in level, the pull-up signal vblp_high and the drive voltage vblp_drv_off are enabled high in level and the pull-down signal vblp_low is disabled low in level. The driving of the bit line precharge voltage generator 26 is stopped by the high-level drive voltage vblp_drv_off. Also, the NMOS transistor N20 is turned on by the high-level pull-up signal vblp_high, and the NMOS transistor N22 is turned off by the low-level pull-down signal vblp_low. As a result, the bit line precharge voltage VBLP at the node A has the core voltage Vcore level.

When the first test mode signal tm_rcp_high is low in level and the second test mode signal tm_rcp_low is high in level, the pull-down signal vblp_low and the drive voltage vblp_drv_off are enabled high in level and the pull-up signal vblp_high is disabled low in level. The driving of the bit line precharge voltage generator 26 is stopped by the high-level drive voltage vblp_drv_off. Also, the NMOS transistor N22 is turned on by the high-level pull-down signal vblp_low, and the NMOS transistor N20 is turned off by the low-level pull-up signal vblp_high. As a result, the bit line precharge voltage VBLP at the node A has the ground voltage VSS level. When both the first test mode signal tm_rcp_high and second test mode signal tm_rcp_low are high in level, all the pull-up signal vblp_high, pull-down signal vblp_low and drive voltage vblp_drv_off are enabled high in level. As a result, both the NMOS transistor N20 and NMOS transistor N22 are turned on, so as to stop the driving of the bit line precharge voltage generator 26. Consequently, the node A floats, so that the bit line precharge voltage VBLP can be replaced with the voltage applied externally through the pad PAD.

As described above, in the present embodiment, the bit line precharge voltage VBLP can be set to the core voltage Vcore level or ground voltage VSS level by the first test mode signal tm_rcp_high and the second test mode signal tm_rcp_low. Alternatively, the bit line precharge voltage VBLP may be set to the predetermined level applied externally through the pad PAD. In the case where the voltage of the predetermined level is applied as the bit line precharge voltage VBLP through the pad PAD, the bit line precharge voltage VBLP is not at the ground voltage level, but is raised up to 0.3~0.4V so that a test can be carried out with respect to the characteristics of the sense amplifier. Because voltages of various levels can be applied as the bit line precharge voltage VBLP in this manner, it is possible to screen the sensing margin of the sense amplifier.

Finally, in response to the third test mode signal tm_rcpflagb enabled high in level, the driving controller 30 stops the driving of the drive voltage generator 300 that generates the first and second drive voltages RTO and SB. Also, in response to the third test mode signal tm_rcpflagb enabled high in level, a NAND gate ND30 acts as an inverter to transfer the low-level bit line equalize signal bleqb to the node B. The high-level bit line equalize signal bleq is also applied to NMOS transistors N30, N32 and N34. As a result, all the NMOS transistors N30, N32 and N34 are turned on to apply the bit line precharge voltage VBLP to a pair of bit lines BL and /BL.

As described above, in the present embodiment, the core voltage Vcore or ground voltage VSS can be applied as the bit line precharge voltage VBLP to a pair of bit lines BL and /BL according to the first to third test mode signals tm_rcp_high, tm_rcp_low and tm_rcpflagb. Alternatively, the voltage of the predetermined level applied externally through the pad PAD may be applied as the bit line precharge voltage VBLP.

As apparent from the above description of exemplary embodiments, according to the present invention, data of a high level or low level can be written into all cells through the bit line precharge voltage VBLP. Therefore, once a cell active operation based on a row address is performed, the characteristics of sense amplifiers can be screened by writing data of a high level or low level into all cells. This is particularly advantageous to low-frequency equipment tCK.

Although preferred embodiments of the present invention have been disclosed for illustrative purposes, those skilled in the art will appreciate that various modifications, additions and substitutions are possible, without departing from the scope and spirit of the disclosure and the accompanying claims.

The present application claims priority to Korean patent application number 10-2006-0138800, filed on Dec. 29, 2006, which is incorporated by reference in its entirety.

What is claimed is:

1. A sense amplifier screen circuit comprising:
   a test mode signal generator for generating a test mode signal;
   a voltage regulator for regulating a bit line precharge voltage in response to the test mode signal;
   a drive voltage generator configured to generate first and second drive voltages to drive the sense amplifier in response to the test mode signal; and
   an enable controller for controlling transmission of a bit line equalize signal in response to the test mode signal.

2. The sense amplifier screen circuit according to claim 1, wherein the test mode signal generator comprises:
   a test mode signal generation circuit for generating first and second test mode signals; and
   a logic circuit for performing a logic operation with respect to the first and second test mode signals to generate a third test mode signal.

3. The sense amplifier screen circuit according to claim 2, wherein the logic circuit performs an OR operation.

4. The sense amplifier screen circuit according to claim 2, wherein the voltage regulator applies any one of an internal voltage, an external voltage, a ground voltage and a variable voltage as the bit line precharge voltage according to a combination of the first and second test mode signals.

5. The sense amplifier screen circuit according to claim 4, wherein the variable voltage is set to a desired level through a pad.

6. The sense amplifier screen circuit according to claim 2, wherein the voltage regulator comprises:
   a first logic circuit configured to receive the first and second test mode signals and generate a pull-up signal;
   a second logic circuit configured to receive the first and second test mode signals and generate a pull-down signal to pull the bit line precharge voltage down; and
   a third logic circuit configured to receive the first and second test mode signals and generate a drive voltage to control driving of a voltage generator which generates the bit line precharge voltage.

7. The sense amplifier screen circuit according to claim 6, wherein each of the first and second logic circuits performs an AND operation, and the third logic circuit performs an OR operation.

8. The sense amplifier screen circuit according to claim 6, wherein the voltage regulator further comprises:
   a pull-up device for pulling the bit line precharge voltage up in response to the pull-up signal; and
   a pull-down device for pulling the bit line precharge voltage down in response to the pull-down signal.

9. The sense amplifier screen circuit according to claim 8, wherein the pull-up device is a p-channel metal oxide semiconductor (PMOS) transistor, and the pull-down device is an n-channel metal oxide semiconductor (NMOS) transistor.

10. A sense amplifier screen method comprising:
    generating first to third test mode signals;
    regulating a bit line precharge voltage in response to the first and second test mode signals;
    generating first and second drive voltages to drive the sense amplifier in response to the third test mode signal; and
    controlling enabling of a bit line equalize signal in response to the third test mode signal.

11. The sense amplifier screen method according to claim 10, wherein the step for regulating a bit line precharge voltage comprises pulling the bit line precharge voltage up or down in response to the first and second test mode signals.

12. The sense amplifier screen method according to claim 10, wherein the step for regulating a bit line precharge voltage comprises generating a voltage applied through a pad as the bit line precharge voltage in response to the first and second test mode signals.

13. The sense amplifier screen method according to claim 10, wherein the step for regulating a bit line precharge voltage further comprises stopping driving of a bit line precharge voltage generator in response to the first and second test mode signals.

14. The sense amplifier screen method according to claim 10, wherein the step for controlling enabling of a bit line equalize signal further comprises stopping driving of a sense amplifier.

* * * * *